United States Patent
Sechrist et al.

(10) Patent No.: US 9,232,676 B2
(45) Date of Patent: Jan. 5, 2016

(54) SPACERS FOR A CABLE BACKPLANE SYSTEM

(71) Applicant: Tyco Electronics Corporation, Berwyn, PA (US)

(72) Inventors: Joshua Tyler Sechrist, Etters, PA (US); Christopher David Ritter, Hummelstown, PA (US); Nathan Glenn Lehman, Harrisburg, PA (US); Brian Patrick Costello, Scotts Valley, CA (US); Robert Paul Nichols, Vacaville, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 274 days.

(21) Appl. No.: 13/911,214

(22) Filed: Jun. 6, 2013

(65) Prior Publication Data

US 2014/0362549 A1 Dec. 11, 2014

(51) Int. Cl.
*H05K 1/14* (2006.01)
*H05K 7/14* (2006.01)
*H04Q 1/02* (2006.01)

(52) U.S. Cl.
CPC ............... *H05K 7/1449* (2013.01); *H04Q 1/15* (2013.01)

(58) Field of Classification Search
CPC .............. H05K 7/1449; H05K 7/1491; H05K 2201/2027; H05K 3/301; H05K 7/142; H05K 7/1438; H05K 7/1452; H05K 2201/044; H05K 7/1439; H01R 13/514; H01R 12/716; H01R 13/6315; H01R 13/73; H01R 13/748; H04Q 1/15

USPC ......... 361/724, 742, 752, 758, 770, 796, 804; 439/65, 247

See application file for complete search history.

(56) References Cited

U.S. PATENT DOCUMENTS

| | | | | |
|---|---|---|---|---|
| 4,432,604 A * | 2/1984 | Schwab | ............... | G02B 6/3817 385/60 |
| 6,404,650 B1 * | 6/2002 | Boniface | .............. | H05K 7/1439 174/138 G |
| 7,704,077 B1 * | 4/2010 | Morley | ................ | H01R 12/737 439/63 |
| 2005/0067358 A1 * | 3/2005 | Lee | ....................... | H05K 7/1491 211/26 |
| 2012/0170191 A1 * | 7/2012 | Jensen | .................... | G06F 1/185 361/679.02 |

\* cited by examiner

*Primary Examiner* — Jinhee Lee
*Assistant Examiner* — James Wu

(57) ABSTRACT

A cable backplane system includes a backplane having a plurality of openings therethrough and a plurality of mounting blocks. A cable rack is coupled to a rear of the backplane and includes a tray having a frame surrounding a raceway. Spacers are coupled to the tray that are secured to corresponding mounting blocks to position the spacers relative to the backplane. Cable connector assemblies are held by the tray. Each cable connector assembly has a plurality of cables extending between at least two cable connectors. The cables are routed in the raceway. Each cable connector assembly is positioned between and supported by corresponding spacers on opposite sides of the cable connector assemblies. The spacers allow limited movement of the cable connectors in at least two directions to allow alignment of the cable connectors within corresponding openings in the backplane.

17 Claims, 12 Drawing Sheets

SPACERS FOR A CABLE BACKPLANE SYSTEM

BACKGROUND OF THE INVENTION

The subject matter herein relates generally to spacers for a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. Holding the cable connectors in proper position for mating with the line and switch cards is difficult.

A need remains for a cable backplane system that may be assembled in a cost effective and reliable manner.

BRIEF DESCRIPTION OF THE INVENTION

In one embodiment, a cable backplane system is provided including a backplane having a plurality of openings therethrough and a plurality of mounting blocks. A cable rack is coupled to a rear of the backplane and includes a tray having a frame surrounding a raceway. Spacers are coupled to the tray that are secured to corresponding mounting blocks to position the spacers relative to the backplane. Cable connector assemblies are held by the tray. Each cable connector assembly has a plurality of cables extending between at least two cable connectors. The cables are routed in the raceway. Each cable connector assembly is positioned between and supported by corresponding spacers on opposite sides of the cable connector assemblies. The spacers allow limited movement of the cable connectors in at least two directions to allow alignment of the cable connectors with corresponding openings in the backplane.

Optionally, the spacers may be able to float relative to the frame with a predefined limited amount of movement to allow positioning of the cable connectors with respect to the backplane. The spacers may include pockets and the cable connectors include lugs received in corresponding pockets. The pockets may be oversized relative to the lugs to allow a limited range of motion of the lugs within the pockets. The spacers may allow movement of the cable connectors in X, Y and Z directions relative to the frame.

Optionally, the spacers may be fixed in position relative to the backplane when the spacers are secured to corresponding mounting blocks. The cable connectors may be movable relative to the spacers and the backplane after the spacer are fixed in position relative to the backplane. The spacer may include a front facing the backplane. The spacer may include guide pins extending from the front that are loaded into guide openings in the backplane to position the spacer relative to the backplane.

Optionally, the spacers may be mechanically coupled to the frame of the tray. The spacers may be secured to corresponding mounting blocks to mechanically couple the tray to the backplane. The spacer may include a flange proximate to a rear of the spacer. The flange may be positioned rearward of the cable connector and may support the cable connector from retreating from the backplane. The cable connector may include a housing and a plurality of contact modules held by the housing. The cables may extend rearward from the contact modules. The flange may block rearward movement of the contact module with respect to the housing to retain the contact module in the housing.

In another embodiment, a cable backplane system is provided that includes a backplane having a plurality of openings therethrough and a plurality of mounting blocks and a cable rack coupled to a rear of the backplane. The cable rack has a tray having a frame surrounding a raceway and spacers coupled to the tray using float mechanisms. The float mechanisms allow the spacers to float relative to the frame to align the spacers with corresponding mounting blocks. The spacers may be secured to corresponding mounting blocks to position the spacers relative to the backplane. The spacers having sides with pockets. Cable connector assemblies are held by corresponding spacers. Each cable connector assembly has a plurality of cables extending between at least two cable connectors. The cables are routed in the raceway and each cable connector has lugs extending from opposite sides thereof. The lugs are received in corresponding pockets. The lugs are undersized relative to the pockets allowing limited movement of the cable connectors in at least two directions relative to the spacers to allow alignment of the cable connectors with corresponding openings in the backplane.

In a further embodiment, a cable rack for a cable backplane system is provided that includes a tray having a frame with side walls surrounding a raceway. A spacer is coupled to the tray using float mechanisms. The float mechanisms allow the spacer to float relative to the side walls. The spacer has first and second ends facing corresponding side walls and engaging the float mechanisms. The spacer has first and second sides extending between the first and second ends. The first and second sides have pockets. A first cable connector assembly is supported by the spacer and a second cable connector assembly supported by the spacer. The first and second cable connector assemblies each have a plurality of cables extending between at least two cable connectors. The cables are routed in the raceway and each cable connector has a lug extending therefrom. The lug of the cable connector of the first cable connector assembly is received in the pocket in the first side of the spacer and the lug of the cable connector of the second cable connector assembly is received in the pocket in the second side of the spacer. The lugs are undersized relative to the pockets allowing limited movement of the cable connectors in at least two directions relative to the spacer and relative to one another.

DETAILED DESCRIPTION OF THE INVENTION

Figure 1:
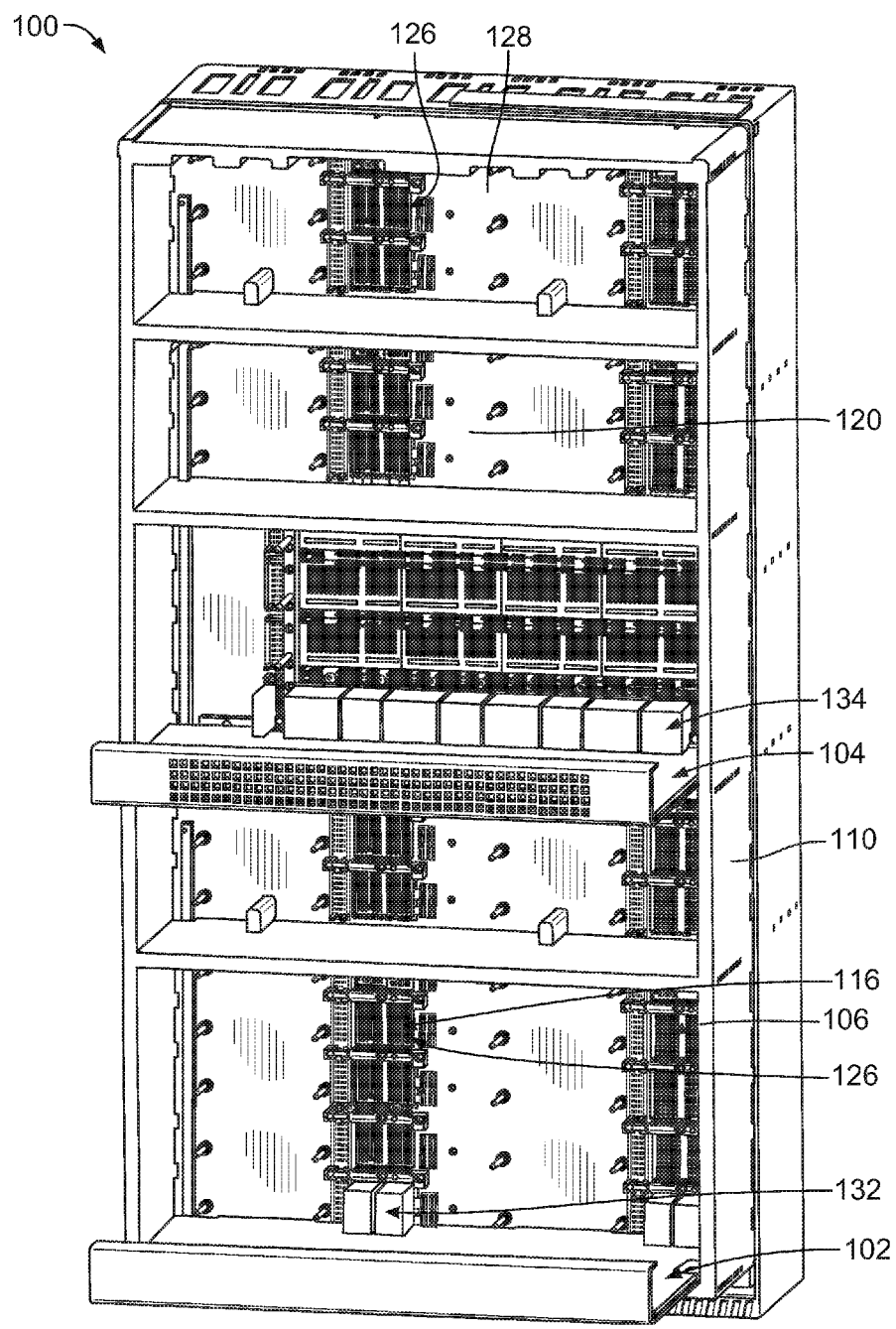
FIG. 1 is a front perspective view of a cable backplane system formed in accordance with an exemplary embodiment.
Figure 2:
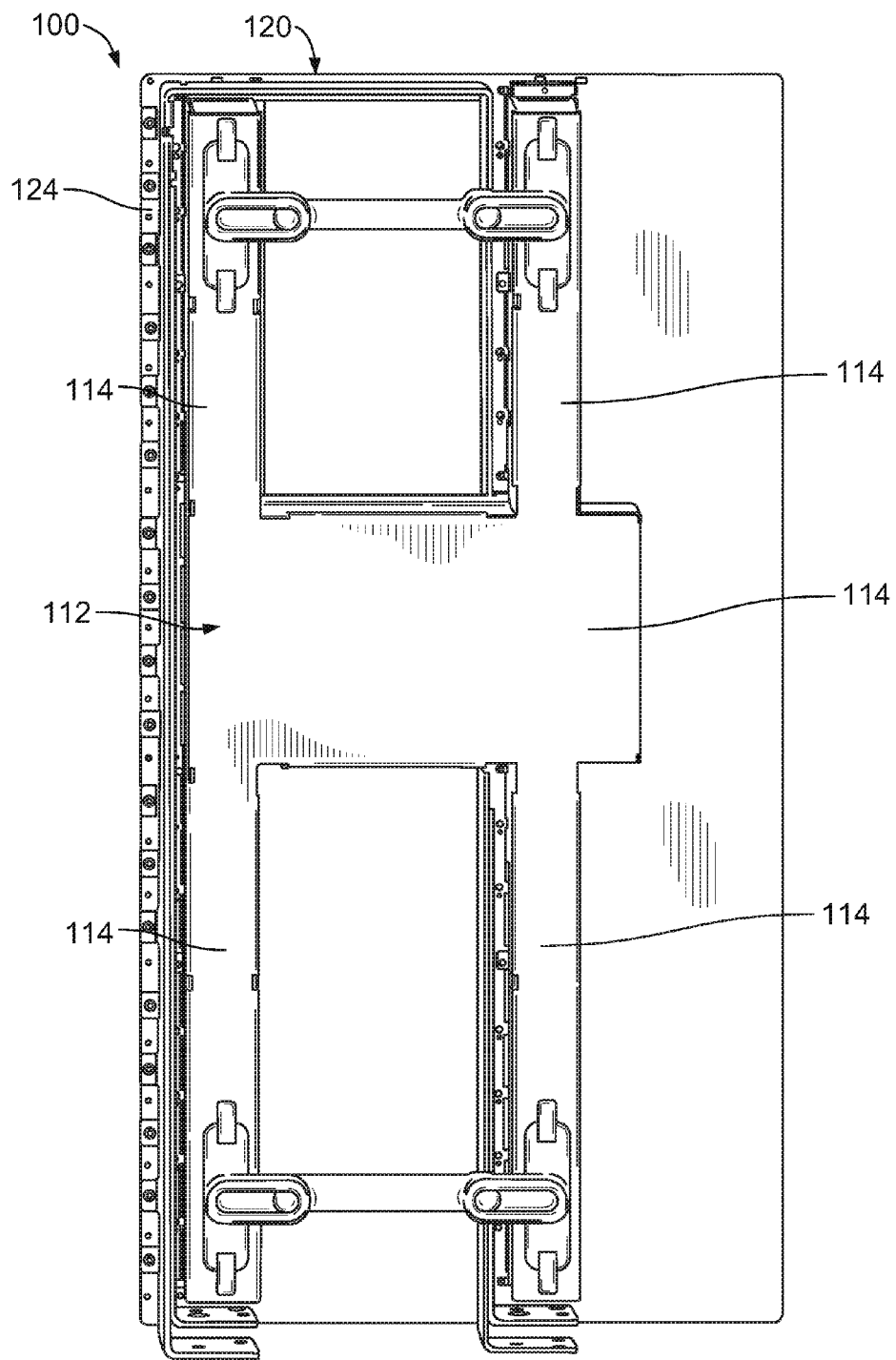
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 that supports and/or manages the cables of the cable connector assemblies 106. The cable rack 112 includes a plurality of trays 114 that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces of the backplane 120.

The backplane 120 and cable rack 112, with the cable connector assemblies 106, are coupled together to form the cable backplane system 100. The cable rack 112 is provided along a rear 124 of the backplane 120. The cable connectors 116 extend through openings 126 in the backplane 120 and are presented at a front 128 of the backplane 120 for mating with the line and switch cards 102, 104. The cable connectors 116 are not electrically connected to the backplane 120, as is typical of conventional backplanes, but rather the cable connectors 116 are interconnected by cables extending between the cable connectors 116.

In an exemplary embodiment, the cable rack 112 is flexible to allow the cable connectors 116 to align with and pass through the openings 126. Optionally, portions of the trays 114 may pass through the openings 126 with the cable connectors 116. The trays 114 may float relative to each other to properly align the cable connectors 116 with the corresponding openings 126. The backplane 120 holds the cable connectors 116 in precise locations for mating with the line and switch cards 102, 104. The backplane 120 has tight tolerances to control mating with the line and switch cards 102, 104. The cable rack 112 is flexible to allow the trays 114 to be properly aligned relative to the backplane 120. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 132, 134, respectively, that mate with corresponding cable connectors 116. The cable connectors 116 need to be precisely positioned relative to the backplane 120 for mating with corresponding card connectors 132, 134.

Figure 3:
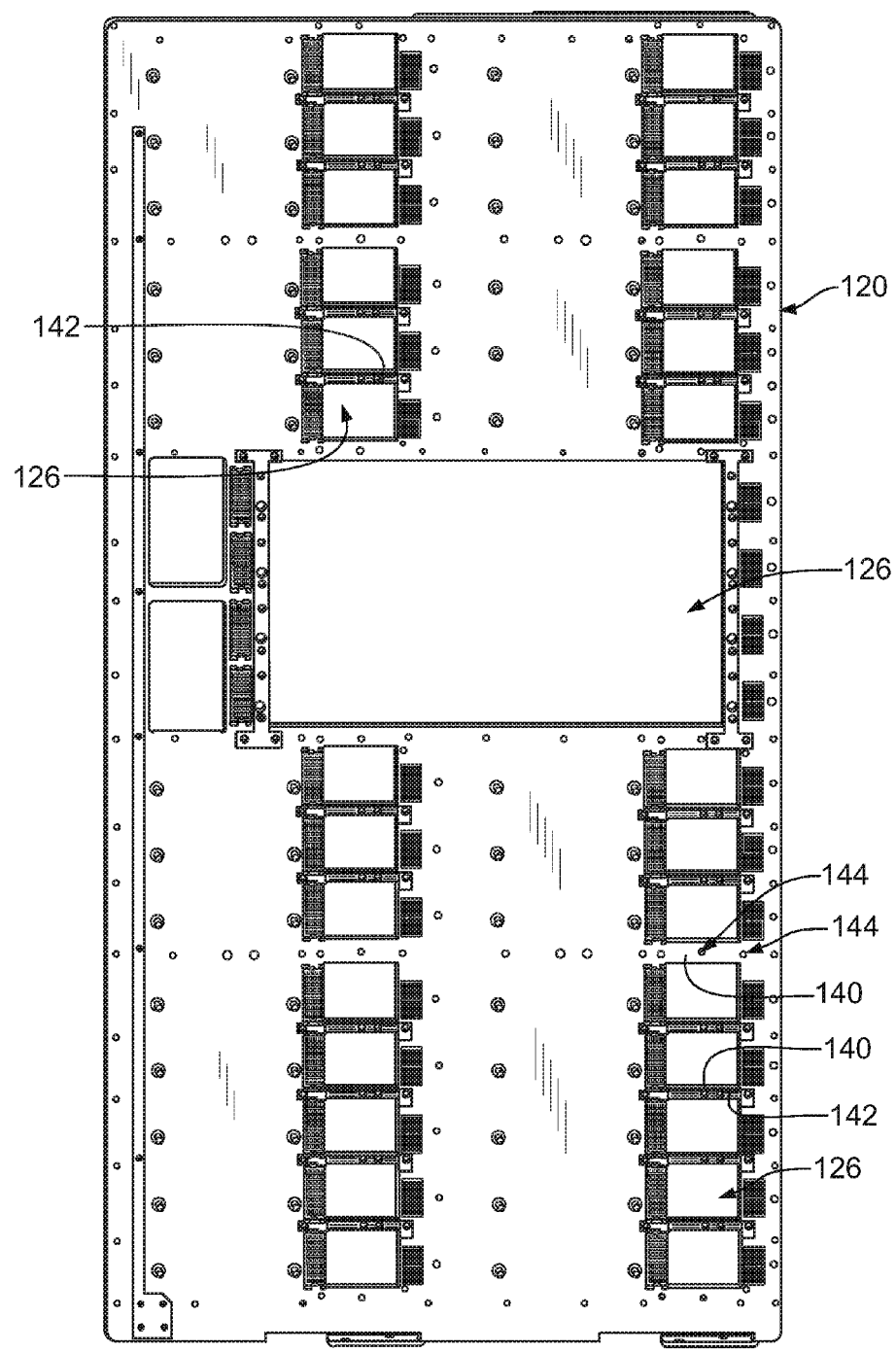
FIG. 3 illustrates a backplane of the cable backplane system and formed in accordance with an exemplary embodiment.

FIG. 3 illustrates the backplane 120 formed in accordance with an exemplary embodiment. The backplane 120 includes the openings 126 that receive the cable connectors 116 and/or portions of the trays 114 (both shown in FIG. 1). The openings 126 may be single openings that receive single cable connectors 116, such as the cable connectors 116 associated with the line cards 102 (shown in FIG. 1). The openings 126 may be large openings that receive multiple cable connectors 116, such as the cable connectors associated with the switch cards 104 (shown in FIG. 1).

The backplane 120 includes crossbars 140 between adjacent openings 126. The crossbars 140 provide support for the backplane 120. The crossbars 140 provide a mounting location for mounting blocks 142 (examples of which are shown mounted to the backplane 120 for reference) used to secure the cable connectors 116 to the backplane 120. Optionally, mounting blocks 142 may be provided at each crossbar 140. Mounting blocks 142 may be provided adjacent each opening 126. The crossbars 140 may define stiffeners for the mounting blocks 142 during assembly of the cable backplane system 100 (shown in FIG. 1). The mounting blocks 142 may be metal stiffeners separately fabricated from the backplane 120 and attached to the backplane 120. Alternatively, the mounting blocks 142 may be part of the backplane 120. For example, the mounting blocks 142 may be defined by an opening through the backplane 120 and the area of the backplane 120 around such opening. The opening may be threaded. The backplane 120 may be thicker in the area of the mounting block 142 to add rigidity to the backplane 120 in such area.

The backplane 120 includes holes 144 therethrough that receive guide features, fasteners or other components used to assembly the cable backplane system 100. The backplane 120 may include component openings 146 therethrough that receive other electrical components that are attached to the backplane 120. Some electrical components may be surface mounted to the backplane 120.

Figure 4:
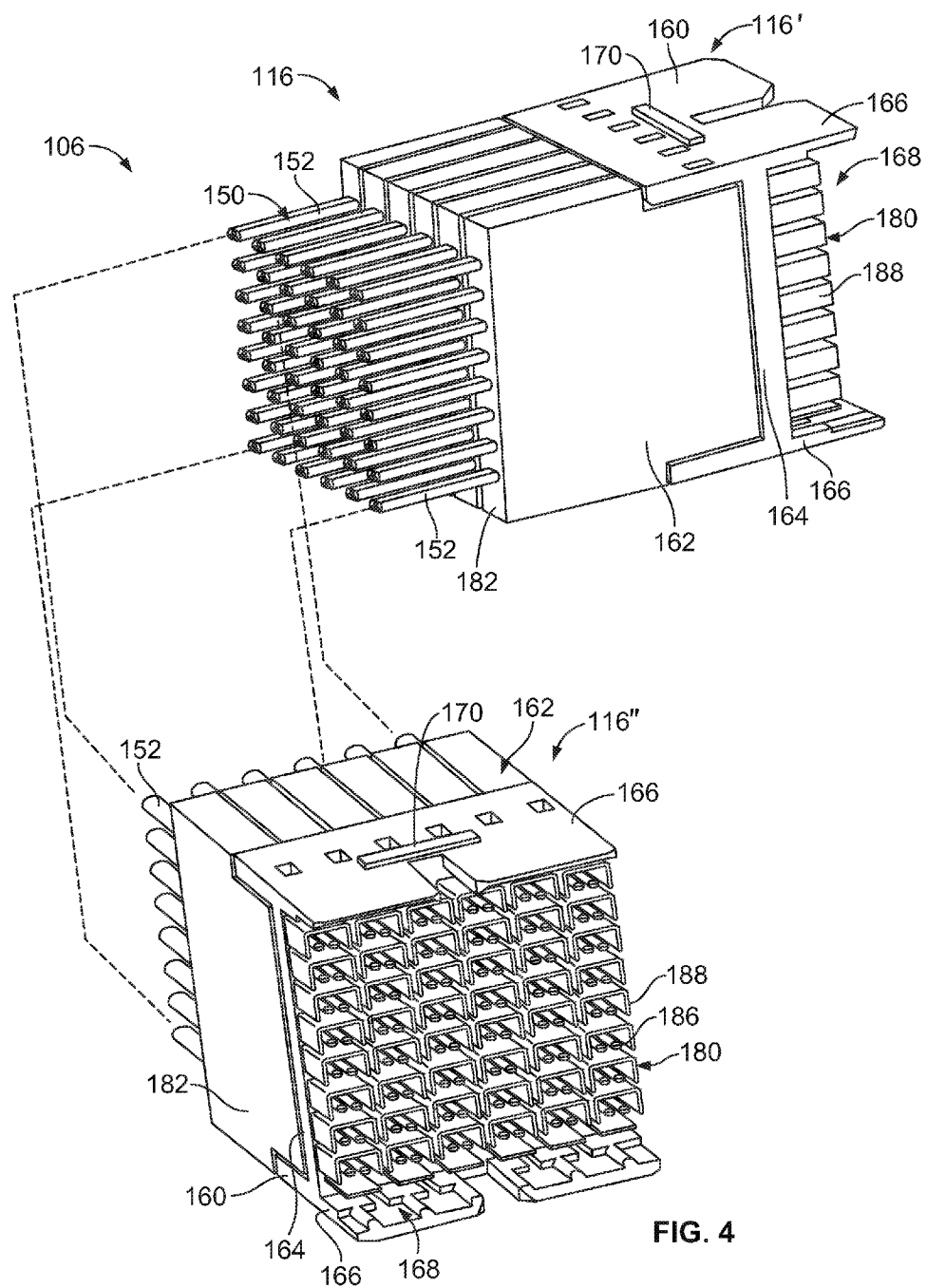
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield to electrically common each ground shield 188 and a dielectric overmold overmolded around the cables 106 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
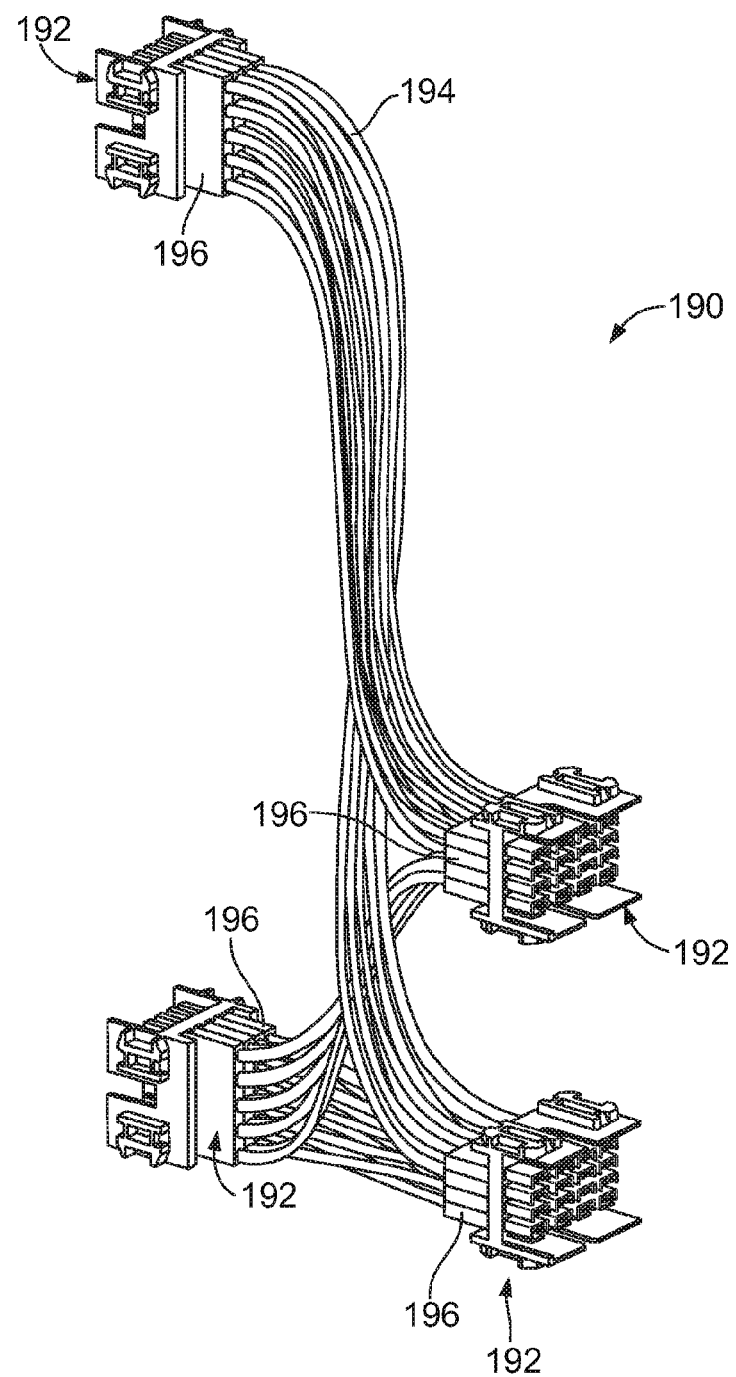
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
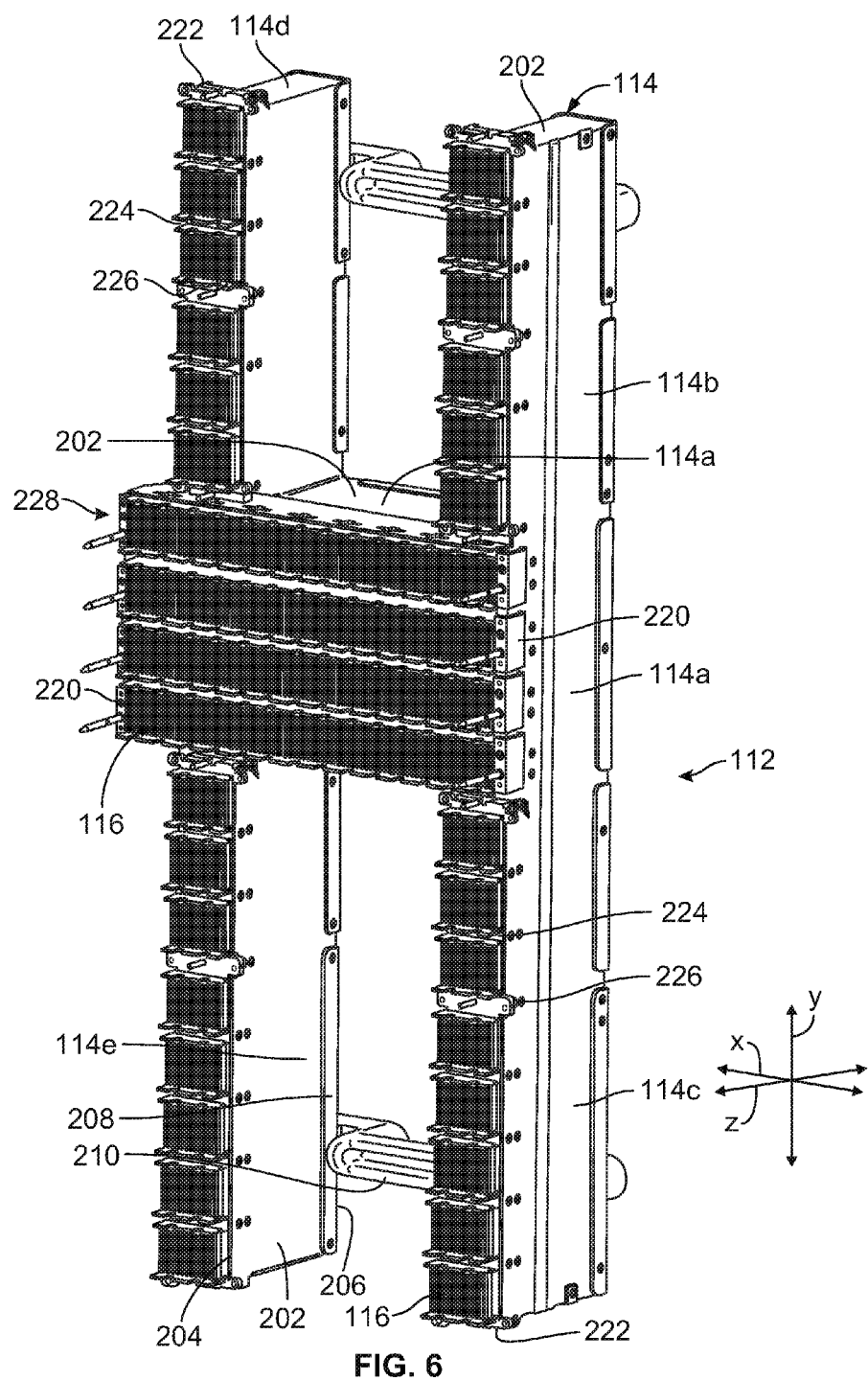
FIG. 6 illustrates a cable rack of the cable backplane system and formed in accordance with an exemplary embodiment.

FIG. 6 illustrates the cable rack 112. The cable rack 112 includes one or more trays 114 connected together to form the cable rack 112. In the illustrated embodiment, the cable rack 112 includes five trays 114a, 114b, 114c, 114d and 114e; however any number of trays 114 may be used in alternative embodiments. The trays 114 are coupled together into an H-shaped configuration having the first tray 114a at a central location with the other trays 114b, 114c, 114d, 114e extending outward from the first tray 114a as legs. The cable rack 112 may have other shapes in alternative embodiments.

In an exemplary embodiment, the first tray 114a is used to hold the cable connectors 116 that are mated with the card connectors 134 of the switch cards 104 (both shown in FIG. 1). The cable connectors 116 in the first tray 114a may be held together as a brick 228. The cable connectors 116 of each brick 228 are connected to the card connectors 134 of the same switch card 104. The other trays 114b, 114c, 114d, 114e are used to hold the cable connectors 116 that are mated with the card connectors 132 of the line cards 102 (both shown in FIG. 1). Optionally, the cable connectors 116 aligned at the same vertical position but in different trays (e.g. 114b and 114d or 114c and 114e) are connected to the card connectors 132 of the same line card 102.

Each tray 114 includes a frame 200 surrounding a raceway through which the cables 152 (shown in FIG. 4) are routed. The raceways are open to one another to allow the cables 152 to be routed from one tray 114 into another tray 114. The frame 200 includes side walls 202 extending between a front edge 204 and a rear 206 of the tray 114. A back wall 208 covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120. Optionally, the trays 114 may be connected to each other with some freedom of movement or float built in to the connection to allow the trays 114 to move relative to one another to properly align the cable connectors 116 with the openings 126 in the backplane 120.

In an exemplary embodiment, the cable rack 112 includes handles 210 used to hold the trays 114 together. The handles 210 may be used to pick up the cable rack 112 and load the cable rack 112 onto the backplane 120 during assembly. Because of the size of the cable rack 112, assembly and loading of the cable connectors 116 and/or front edge 204 of the frame 200 into the openings 126 may be difficult. The handles 210 make moving of the cable rack 112 easier. The handles 210 may be removable once the cable rack 112 is coupled to the backplane 120.

The cable rack 112 includes a plurality of spacers 220, 222, 224, 226 used to hold positions of the cable connectors 116. The spacers 220, 222, 224, 226 may be different types of spacers. The spacers 220, 222, 224, 226 may have different sizes, shapes and/or features, such as guide pins. The spacers 220, 222, 224, 226 generally have similar functions, such as supporting one or more cable connectors 116.

In the illustrated embodiment, the spacers 220 are provided along sides of corresponding bricks 228 of cable connectors 116 that are located in the tray 114a. The bricks 228 are a group of cable connectors 116 that are held together in a stacked arrangement for mating with a plurality of the card connectors 134 of the same switch card 104 (both shown in FIG. 1). The spacers 220 may be referred to hereinafter as side spacers 220 or brick spacers 220. The spacers 222 are provided at ends of the trays 114b, 114c, 114d, 114e, such as to support the end-most cable connectors 116 in such trays 114. The spacers 222 may be referred to hereinafter as end spacers 222. The end spacers 222 are provided at the top and bottom ends of the cable rack 112. The end spacers 222 support a single cable connector 116. The spacers 224 are provided between adjacent cable connectors 116. The spacers 224 may be referred to hereinafter as intermediate spacers 224. The spacers 224 each support two cable connectors 116. The spacers 226 are provided between adjacent cable connectors 116, similar to the intermediate spacers 224; however the spacers 226 have guide pins extending therefrom, which may be used for guiding the cable rack 112 into alignment and engagement with the backplane 120. The spacers 226 may be referred to hereinafter as guide spacers 226.

In an exemplary embodiment, the cable connectors 116 are movable relative to the spacers 220, 222, 224, 226 to allow the cable connectors 116 to align with the corresponding openings 126 during assembly of the cable rack 112 and backplane 120. For example, the spacers 220, 222, 224, 226 may allow X, Y and/or Z float to allow fine alignment of the cable connectors 116 with the openings 126. Once the cable connectors 116 are positioned in the openings 126, the spacers 220, 222, 224, 226 may be fixed to the mounting blocks 142 (shown in FIG. 3), such as using fasteners to securely couple the cable rack 112 to the backplane 120 with the cable connectors 116 generally in position for mating with the corresponding card connectors 132, 134. In an exemplary embodiment, the cable connectors 116 are configured to float within the openings 126 relative to the spacers 220, 222, 224, 226 to obtain a true position for aligning to and mating with the corresponding card connectors 132, 134.

Figure 7:
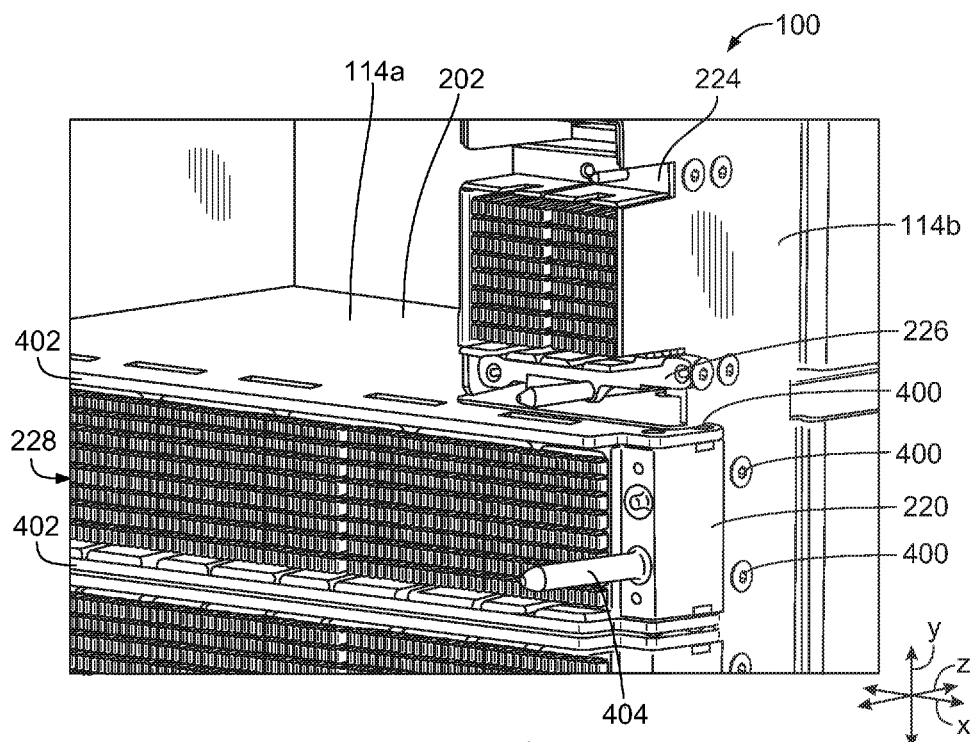
FIG. 7 is a front view of a portion of the cable backplane system.

FIG. 7 is a front view of a portion of the cable backplane system 100. FIG. 7 illustrates the trays 114a, 114b showing the spacers 220, 224, 226 used for mounting the trays 114 to the backplane 120 (shown in FIG. 1). FIG. 7 illustrates the side spacers 220 coupled to the bricks 228, forming part of the first tray 114a. Each brick 228 includes plates 402, which may be top and bottom plates extending along tops and bottoms of the cable connectors 116. The plates 402 hold the cable connectors 116 of the brick 228. The plates 402 may form parts of the side walls 202 of the tray 114a. The side spacers 220 are positioned between the plates 402.

The side spacers 220 are configured to be coupled to corresponding mounting blocks 142 (shown in FIG. 3) on the backplane 120 (shown in FIG. 1). The mounting blocks 142 secure the side spacers 220 in place relative to the backplane 120. However, the side spacers 220 are coupled to the plates 402, and thus the first tray 114a, using float mechanisms 400. The float mechanisms 400 allow movement in mutually perpendicular X, Y and/or Z directions. The side spacers 220 are movable relative to the plates 402 using the float mechanisms 400 to properly position the cable connectors 116 relative to the backplane 120.

In an exemplary embodiment, the first tray 114a is secured to the second tray 114b using float mechanisms 400. The float mechanisms 400 are used to couple the side spacers 220 to the second tray 114a. The side spacers 220 are movable relative to the second tray 114b using corresponding float mechanisms 400. The first and second trays 114a, 114b are movable relative to one another using the float mechanisms 400. The float mechanisms 400 allow movement in the X, Y and Z directions. The other trays 114 may be connected together in a similar manner using similar types of float mechanisms 400.

In an exemplary embodiment, the float mechanism 400 is a fastener such as a countersink screw. The float mechanisms 400 may be fasteners that are received in oversized holes or apertures in the trays 114 that allow the float mechanisms 400 to move in one or more directions relative to the trays 114. A circumferential gap may be defined around the float mechanism 400 in the aperture in the side wall 202 allowing the float mechanism 400 to move within the aperture. The size of the gap defines the amount of float. Optionally, the gap may allow approximately 1.0 mm of float in the X, Y and Z directions; however the gap may allow more or less float in alternative embodiments. Other types of float mechanisms may be used in alternative embodiments that tie the trays 114 together but allow limited relative movement therebetween.

Figure 8:
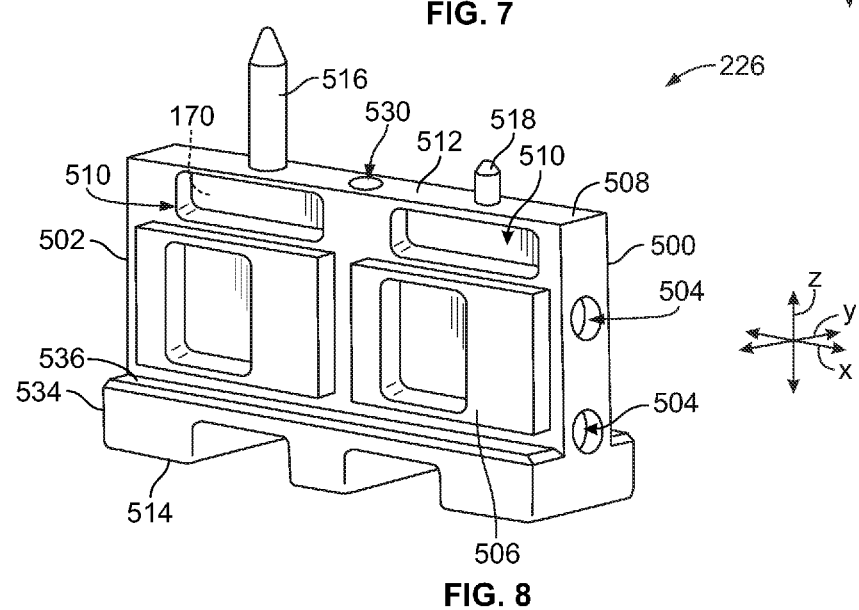
FIG. 8 is a perspective view of one of a spacer formed in accordance with an exemplary embodiment.
Figure 9:
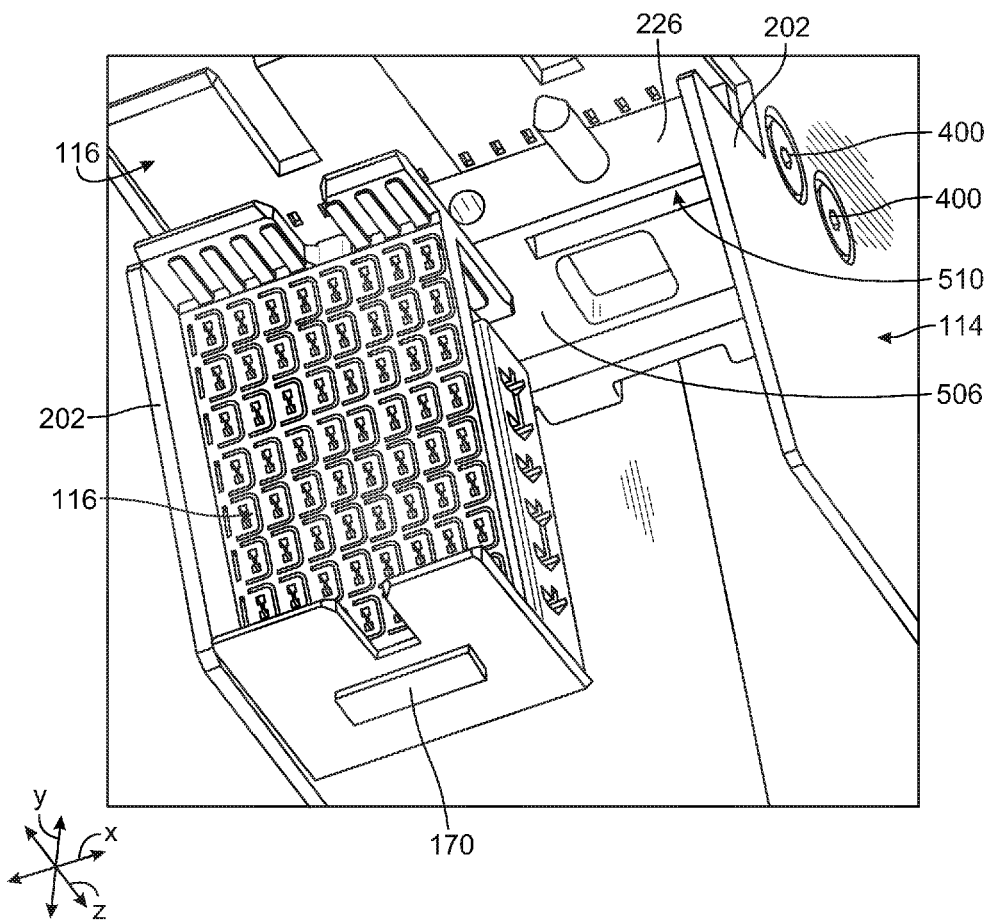
FIG. 9 illustrates a portion of the cable backplane system showing the spacer within a tray of the cable rack and supporting cable connectors.
Figure 10:
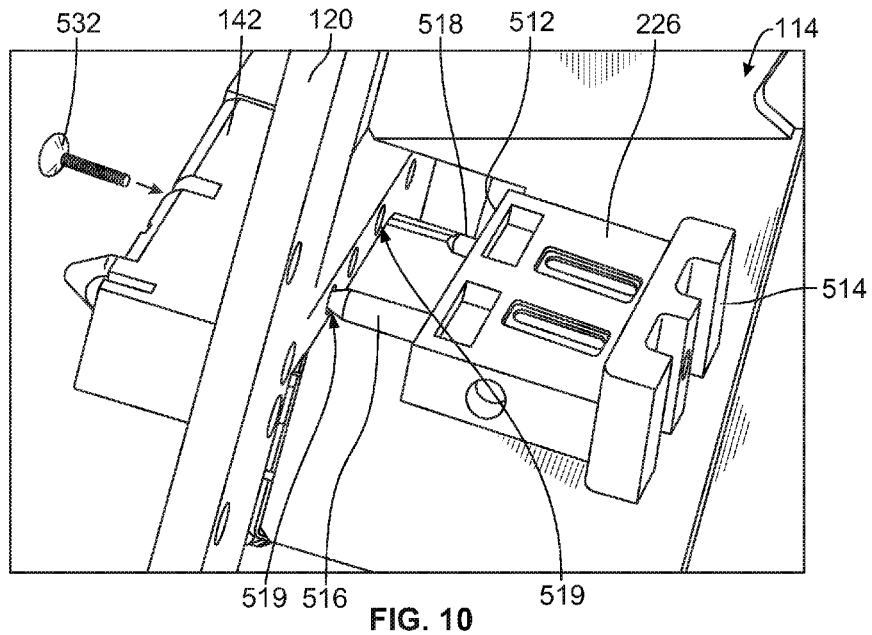
FIG. 10 illustrates a portion of the cable backplane system showing the tray with the spacer poised for mating with the backplane.
Figure 11:
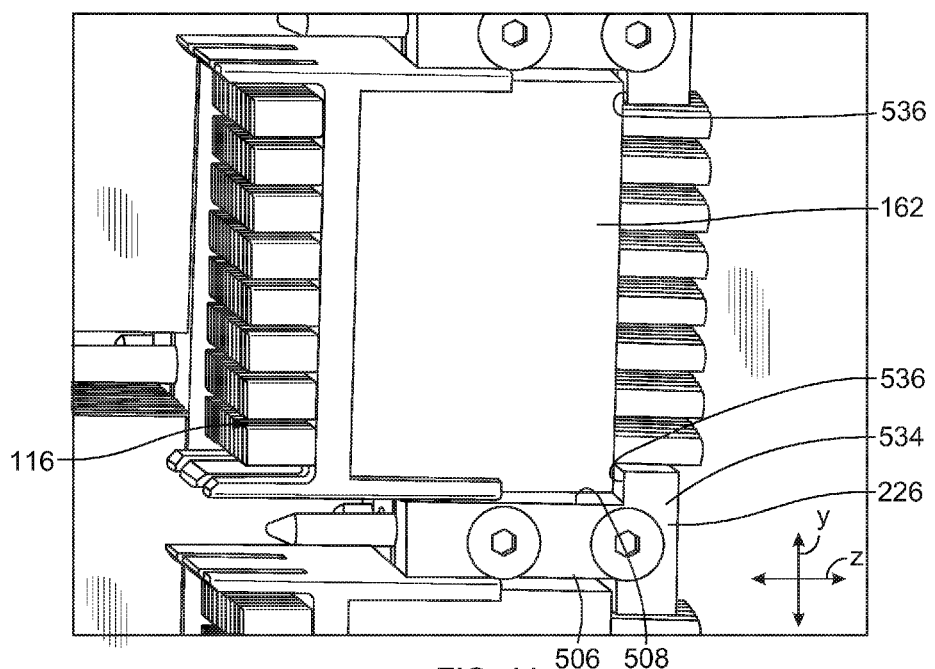
FIG. 11 illustrates a portion of the cable backplane system showing spacers supporting corresponding cable connectors.

FIG. 8 is a perspective view of one of the guide spacers 226 (or simply spacer 226) formed in accordance with an exemplary embodiment. FIG. 9 illustrates a portion of the cable backplane system 100 showing the spacer 226 within the tray 114 and supporting the cable connectors 116. FIG. 10 illustrates a portion of the cable backplane system 100 showing the tray 114 with the spacer 226 poised for mating with the backplane 120 and mounting block 142. FIG. 11 illustrates a portion of the cable backplane system 100 showing the spacers 226 supporting corresponding cable connectors 116. The other spacers 220, 222, 224 (shown in FIG. 6) may include similar features as the spacer 226.

With primary reference to FIG. 8, the spacer 226 includes first and second ends 500, 502 configured to face corresponding side walls 202 (shown in FIG. 9). The ends 500, 502 have bores 504 that receive fasteners, such as the float mechanisms 400 (shown in FIG. 9). The bores 504 may be threaded to allow the float mechanisms 400 to be threadably coupled to the guide spacer 226.

The spacer 226 includes first and second sides 506, 508 extending between the first and second ends 500, 502. The first and second sides 506, 508 face in opposite directions and are configured to face corresponding cable connectors 116 (shown in FIG. 9). The spacer 226 is configured to support a first cable connector 116 on the first side 506 and a second cable connector 116 on the second side 508. The spacer 226 supports the cable connectors 116 relative to the tray 114 (shown in FIG. 9). In an exemplary embodiment, the spacer 226 supports the cable connectors 116 in a manner that allows the cable connectors 116 to have limited freedom of movement or float relative to the tray 114 to allow proper positioning of the cable connectors 116 for mating with the card connectors 132, 134 (shown in FIG. 1).

The first and second sides 506, 508 have pockets 510 therein that receive corresponding lugs 170 (shown in FIG. 9) of the cable connectors 116. An outline of one of the lugs 170 is illustrated in FIG. 8 to illustrate the size of the lug 170 relative to the size of the pocket 510. A gap is defined between the lug 170 and the pocket 510, allowing a limited range of motion of the lug 170 within the pocket 510. The pockets 510 are oversized as compared to the lugs 170, which allow limited movement of the cable connectors 116 relative to the spacers 226 in one or more directions. The cable connectors 116 are allowed to float relative to the spacers 226 with a predetermined limited amount of movement to allow positioning of the cable connectors 116 relative to the spacers 226, such as to align the cable connectors 116 with the openings 126 (shown in FIG. 1) and/or the card connectors 132, 134.

The spacer 226 includes a front 512 and a rear 514 opposite the front 512. In an exemplary embodiment, the spacer 226 includes guide pins 516, 518 extending from the front 512. The guide pin 516 is longer than the guide pin 518. The guide pin 516 may be used to initially align the spacer 226 with the backplane 120 (as shown with reference to FIG. 10), such as coarse alignment, while the guide pin 518 may be used to more precisely align the spacer 226 with the backplane 120, such as fine alignment. The guide pins 516, 518 may be loaded through guide openings 519 in the backplane 120 to position the spacer 226 relative to the backplane 120. In an exemplary embodiment, the longer guide pin 516 is received in the mounting block 142, such as in a guide opening in the mounting block 142. The guide pin 516 may be used to position the spacer 226 relative to the mounting block 142. In an exemplary embodiment, the intermediate spacer 224 (shown in FIG. 6) includes the shorter guide pin 518 to align the intermediate spacer 224 with the backplane 120, but does not include one of the longer guide pins 516. In an alternative embodiment, the mounting block 142 and/or the backplane 120 may include the guide pin and the spacer 226 may include the guide opening. In other alternative embodiments, the spacer 226 is guided into position using the guide opening in the backplane 120 without the need for the mounting block 142. The spacer 226 may be secured to the backplane 120 without the need for the mounting block 142.

In an exemplary embodiment, the spacer 226 includes a bore 530 in the front 512. The bore 530 may be threaded. A fastener 532 (shown in FIG. 10) may be used to secure the spacer 226 to the mounting block 142. The spacer 226 may be secured in position relative to the backplane 120 using the fastener 532. The backplane 120 may be captured between the spacer 226 and the mounting block 142 using the fastener 532, which extends through the backplane 120 to threadably, or otherwise, couple the spacer 226 to the mounting block 142.

The spacer 226 includes a flange 534 proximate to the rear 514. In an exemplary embodiment, the flange 534 extends from the first side 506 and the second side 508; however the flange 534 may extend from only one side 506 or 508 in alternative embodiments. For example, the end spacer 222 (shown in FIG. 6) includes a flange extending from only one side as the end spacer 222 is used to support only one cable connector 116. The flange 534 has a forward facing shoulder 536. The forward facing shoulder 536 is used to support the cable connectors 116 (as shown with reference to FIG. 11). For example, the flange 534 is positioned rearward of the cable connectors 116 and supports the cable connectors 116 from retreating from the backplane 102. In an exemplary embodiment, the flange 534 supports the contact modules 162 (shown in FIG. 11). The flange 534 blocks rearward movement of the contact modules 162 with respect to the corresponding housing 160 to retain the contact modules 162 in the housing 160.

Figure 12:
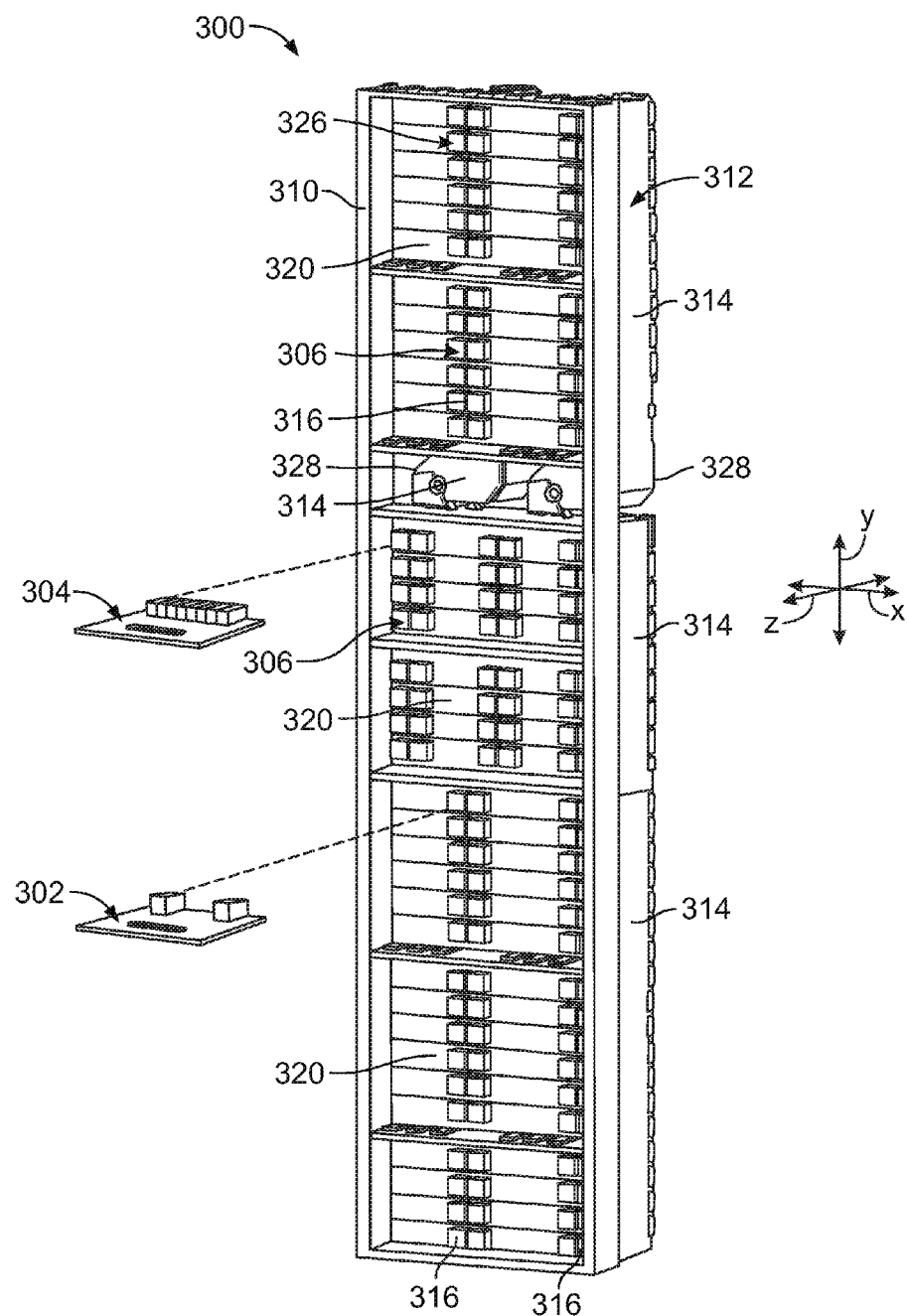
FIG. 12 is a front view of a cable backplane system formed in accordance with an exemplary embodiment.
Figure 13:
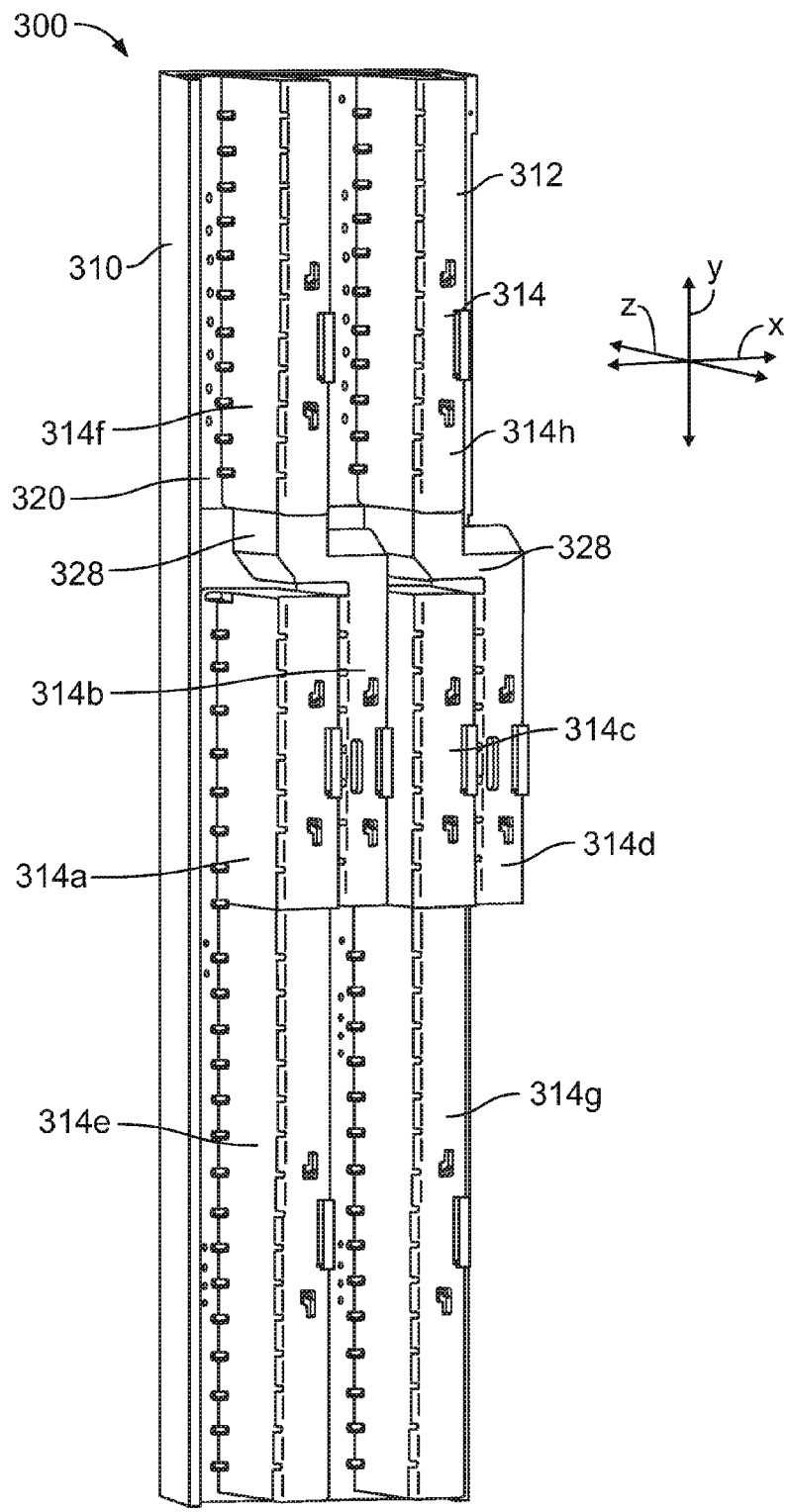
FIG. 13 is a rear perspective view of the cable backplane system.

FIG. 12 is a front view of a cable backplane system 300 formed in accordance with an exemplary embodiment. FIG. 13 is a rear perspective view of the cable backplane system 300. The cable backplane system 300 is similar to the cable backplane system 100 (shown in FIGS. 1 and 2) and includes similar components in a different arrangement than the arrangement of the cable backplane system 100. The cable backplane system 300 interconnects line cards 302 and switch cards 304 using cable connector assemblies 306.

The cable backplane system 300 includes a chassis 310 that supports the components of the cable backplane system 300. The chassis 310 may include a rack, a cabinet or other suitable structures for holding the components of the cable backplane system 300. The cable backplane system 300 includes a cable rack 312 that supports and/or manages the cables of the cable backplane system 300. The cable rack 312 includes a plurality of trays 314 that are held together and extend along different portions of the cable backplane system 300. The trays 314 are arranged in a different arrangement than the arrangement of the trays 114 (shown in FIG. 2). The cable rack 312 supports a plurality of cable connectors 316, which form parts of the cable connector assemblies 306.

The cable backplane system 300 includes a plurality of backplanes 320. The backplanes 320 are separately manufactured from one another and separately mounted to and supported by the chassis 310. In the illustrated embodiment, three backplanes 320 are separately mounted to the chassis 310. The trays 314 interconnect with multiple backplanes 320. In order for the trays 314 to connect to different backplanes 320, the trays 314 are movable relative to each other and/or the backplanes 320. The trays 314 are flexible and have mounting features that allow the trays 314 to float relative to each other. In an exemplary embodiment, the mounting features are float mechanisms directly coupled between two trays 314 that allow the trays 314 to float and move relative to one another in X, Y and Z directions.

In an exemplary embodiment, the cable rack 312 is flexible to allow the cable connectors 316 to align with and pass through openings 326 in the backplanes 320. The trays 314 may float relative to each other to properly align the cable connectors 316 with the corresponding openings 326. The backplane 320 holds the cable connectors 316 in precise locations for mating with the line and switch cards 302, 304.

In the illustrated embodiment, the cable rack 312 includes eight trays 314a, 314b, 314c, 314d, 314e, 314f, 314g and 314h; however any number of trays 314 may be used in alternative embodiments. The trays 314 are coupled together into an H-shaped configuration having four of the trays 314a, 314b, 314c, 314d at a central location with the other trays 314e, 314f, 314g, 314h extending above or below corresponding trays 314a, 314b, 314c, 314d as legs. The bottom trays 314e, 314g are arranged in line with the corresponding center trays 314a, 314c. The top trays 314f, 314h are offset from the corresponding center trays 314b, 314d. The center trays 314b, 314d have transition sections 328 that transition to the top trays 314f, 314h. The top trays 314f, 314h are generally vertically aligned with the bottom trays 314e, 314g. The cable rack 312 may have other shapes in alternative embodiments.

In an exemplary embodiment, the center trays 314a, 314b, 314c, 314d are used to hold the cable connectors 316 that are mated with the card connectors of the switch cards 304 (shown in FIG. 12). The top and bottom trays 314e, 314f, 314g, 314h are used to hold the cable connectors 316 that are mated with the card connectors of the line cards 302 (shown in FIG. 12).

Figure 14:
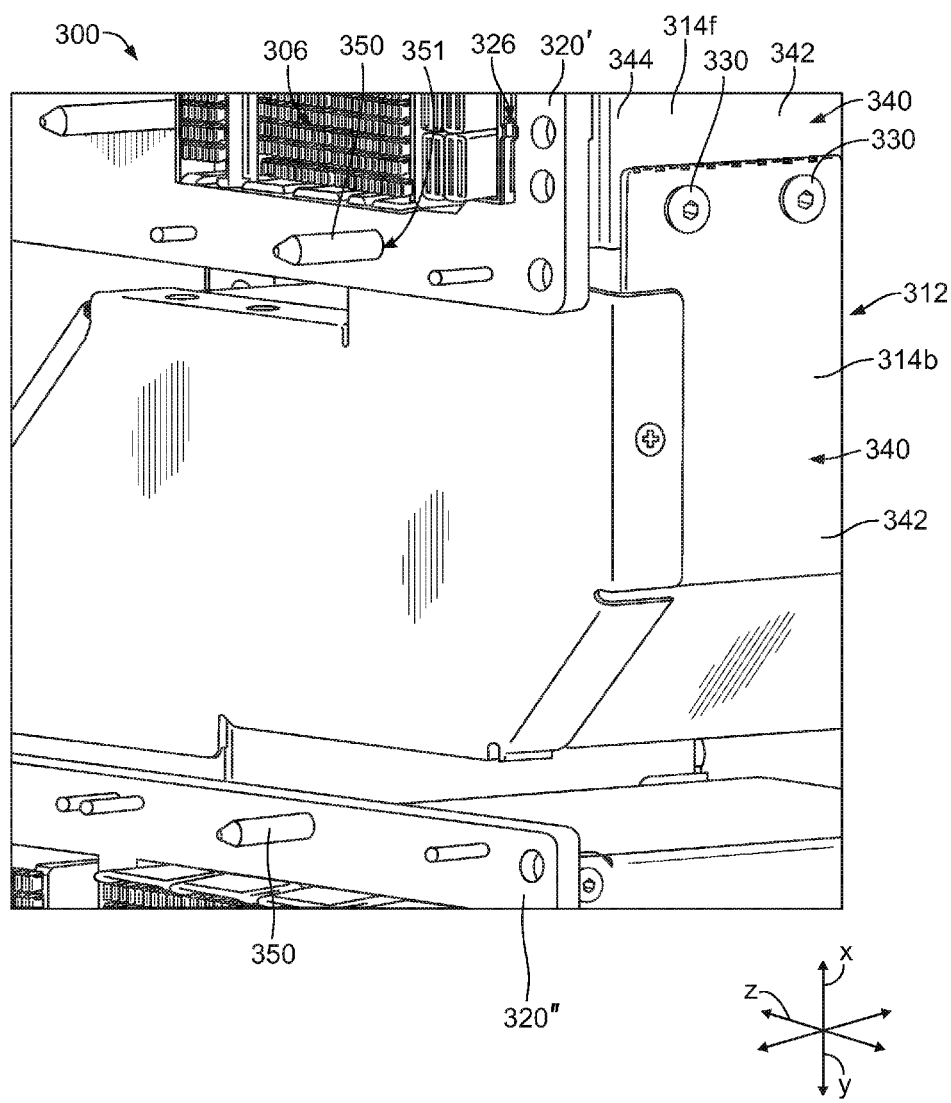
FIG. 14 is a front view of a portion of the cable backplane system.

FIG. 14 is a front view of a portion of the cable backplane system 300. FIGS. 14 illustrates two backplanes 320', 320" mounted to the chassis 310 (shown in FIG. 12). FIGS. 14 illustrate the trays 314b, 314f mounted to the backplanes 320 and secured to each other using float mechanisms 330. The float mechanisms 330 allow the trays 314b, 314f to float and move relative to one another in X, Y and Z directions. The cable connector assemblies 306 within the respective trays 314b, 314f may be aligned with the openings 326 and the float mechanisms 330 allow the trays 314b, 314 to move relative to each other to align with the corresponding openings 326. For example, because the tray 314b is coupled to one backplane 320" while the tray 314f is coupled to the other backplane 320', the trays 314b, 314f need to be able to move relative to each other to allow proper alignment with the corresponding backplane 320. The float mechanisms 330 tie the trays 314 together but allow some float or movement in at least two directions. In an exemplary embodiment the float mechanisms 330 allow relative movement of the trays 314 in three dimensions (e.g. X, Y and Z float). The float mechanisms may be shoulder screws or other types of fasteners that secure the trays 314 together while allowing some limited movement between the trays 314. The trays 314 may have oversized openings that allow the float mechanisms to float within the openings.

The trays 314 each include a frame 340 surrounding a raceway through which cables of the cable connector assemblies 306 (shown in FIG. 12) are routed. The raceways of the trays 314b, 314f are open to one another to allow the cables to be routed from one tray 314b into the other tray 314f. The frame 340 includes side walls 342, which may be sheet metal pieces that are stamped, formed and coupled together, such as using fasteners or other connecting means. The sheet metal may be thin enough to allow the frame 340 to have some flexibility for moving, twisting or otherwise manipulating the trays 314 into position relative to the backplanes 320 to position the cable connectors 316 in the corresponding openings 326. Optionally, the trays 314 may be connected to each other with some freedom of movement or float built in to the connection to allow the trays 314 to move relative to one another to properly align the cable connectors 316 with the openings 326 in the backplanes 320.

In an exemplary embodiment, the cable backplane system 300 includes spacers (not shown), similar to the spacers 220, 222, 224 and/or 226 (shown in FIG. 6), between and supporting corresponding cable connectors 316. At least some of the spacers may include guide pins 350 extending forward therefrom. The guide pins 350 are loaded into corresponding holes 351 in the backplanes 320 to position the cable rack 312 relative to the backplanes 320. The guide pins 350 may fix the X and Y position of the spacer relative to the corresponding backplane 320, however the cable connectors may still be movable, such as to align with the openings 326 and/or the card connectors of the line cards 302 and switch cards 304. The spacers may be secured to the trays 314 using float mechanisms that allow the spacers to float with a limited range of motion relative to the trays 314. The spacers may thus be aligned with mounting blocks on the backplane 320 to position the cable connectors with respect to the openings 326. The float mechanisms may be fasteners that are received in oversized holes in the trays 314 that allow the float mechanisms to move in one or more directions relative to the trays 314.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
   a backplane having a plurality of openings therethrough and a plurality of mounting blocks;
   a cable rack coupled to a rear of the backplane, the cable rack comprising:
   a tray having a frame surrounding a raceway;
   spacers coupled to the tray, the spacers being secured to corresponding mounting blocks to position the spacers relative to the backplane; and
   cable connector assemblies held by the tray, each cable connector assembly having a plurality of cables extending between at least two cable connectors, the cables being routed in the raceway, each cable connector assembly positioned between and supported by corresponding spacers on opposite sides of the cable connector assemblies, the spacers allowing limited movement of the cable connectors in at least two mutually perpendicular directions to allow alignment of the cable connectors with corresponding openings in the backplane.

2. The cable backplane system of claim 1, wherein the spacers are able to float relative to the frame with a predefined limited amount of movement to allow positioning of the cable connectors with respect to the backplane.

3. The cable backplane system of claim 1, wherein the spacers include pockets and the cable connectors include lugs received in corresponding pockets, the pockets being oversized relative to the lugs to allow a limited range of motion of the lugs within the pockets.

4. The cable backplane system of claim 1, wherein the spacers allow movement of the cable connectors in mutually perpendicular X, Y and Z directions relative to the frame.

5. The cable backplane system of claim 1, wherein the spacers are fixed in position relative to the backplane when the spacers are secured to corresponding mounting blocks, the cable connectors being movable relative to the spacers and the backplane after the spacers are fixed in position relative to the backplane.

6. The cable backplane system of claim 1, wherein each spacer includes a front facing the backplane, the spacer includes a guide pin extending from the front, the guide pin being loaded into guide openings in the backplane to position spacers relative to the backplane.

7. The cable backplane system of claim 1, wherein the spacers are mechanically coupled to the frame of the tray, the spacers being secured to corresponding mounting blocks to mechanically couple the tray to the backplane.

8. The cable backplane system of claim 1, wherein each spacer includes a flange proximate to a rear of the spacer, the flange being positioned rearward of the cable connector and supporting the cable connector from retreating from the backplane.

9. The cable backplane system of claim 8, wherein the cable connector comprises a housing and a plurality of contact modules held by the housing, the cables extending rearward from the contact modules, the flange blocking rearward movement of the contact modules with respect to the housing to retain the contact modules in the housing.

10. A cable backplane system comprising:
a backplane having a plurality of openings therethrough and a plurality of mounting blocks;
a cable rack coupled to a rear of the backplane, the cable rack comprising:
a tray having a frame surrounding a raceway;
spacers coupled to the tray using float mechanisms, the float mechanisms allowing the spacers to float relative to the frame to align the spacers with corresponding mounting blocks, the spacers being secured to corresponding mounting blocks to position the spacers relative to the backplane, the spacers having sides with pockets; and
cable connector assemblies held by corresponding spacers, each cable connector assembly having a plurality of cables extending between at least two cable connectors, the cables being routed in the raceway, each cable connector having lugs extending from opposite sides thereof, the lugs being received in corresponding pockets, the lugs being undersized relative to the pockets allowing limited movement of the cable connectors in at least two mutually perpendicular directions relative to the spacers to allow alignment of the cable connectors within corresponding openings in the backplane.

11. The cable backplane system of claim 10, wherein the spacers are able to float relative to the frame with a predefined limited amount of movement to allow positioning of the cable connectors with respect to the backplane.

12. The cable backplane system of claim 10, wherein the spacers allow movement of the cable connectors in mutually perpendicular X, Y and Z directions relative to the frame.

13. The cable backplane system of claim 10, wherein the spacers are fixed in position relative to the backplane when the spacers are secured to corresponding mounting blocks, the cable connectors being movable relative to the spacers and the backplane after the spacers are fixed in position relative to the backplane.

14. The cable backplane system of claim 10, wherein each spacer includes a front facing the backplane, the spacer includes a guide pin extending from the front, the guide pin being loaded into guide openings in the backplane to position spacers relative to the backplane.

15. The cable backplane system of claim 10, wherein the spacers are mechanically coupled to the frame of the tray by the floating mechanisms, the spacers being secured to corresponding mounting blocks to mechanically couple the tray to the backplane, the tray being movable relative to the spacers and the mounting blocks after the spacers are fixed to the mounting blocks.

16. The cable backplane system of claim 10, wherein each spacer includes a flange proximate to a rear of the spacer, the flange being positioned rearward of the cable connector and supporting the cable connector from retreating from the backplane.

17. The cable backplane system of claim 16, wherein the cable connector comprises a housing and a plurality of contact modules held by the housing, the cables extending rearward from the contact modules, the flange blocking rearward movement of the contact modules with respect to the housing to retain the contact modules in the housing.

* * * * *